(12) United States Patent
Doerner et al.

(10) Patent No.: US 6,893,741 B2
(45) Date of Patent: May 17, 2005

(54) MAGNETIC DEVICE WITH IMPROVED ANTIFERROMAGNETICALLY COUPLING FILM

(75) Inventors: Mary F. Doerner, Santa Cruz, CA (US); Eric Edward Fullerton, Morgan Hill, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 78 days.

(21) Appl. No.: 10/602,504

(22) Filed: Jun. 24, 2003

(65) Prior Publication Data

US 2004/0262627 A1 Dec. 30, 2004

(51) Int. Cl.[7] .................. B32B 15/01; B32B 15/04; B32B 15/18; G11B 5/39; G11C 11/15
(52) U.S. Cl. .................. 428/670; 428/678; 428/213; 428/693; 365/158; 360/313; 360/324.1; 360/324.2
(58) Field of Search .................. 428/678, 679, 428/681, 682, 670, 686, 213, 693; 360/313, 314, 315, 324, 324.1, 324.11, 324.12, 324.2, 126; 365/158

(56) References Cited

U.S. PATENT DOCUMENTS

| | | | |
|---|---|---|---|
| 4,814,921 A | * | 3/1989 | Hamakawa et al. ........ 360/126 |
| 5,206,590 A | | 4/1993 | Dieny et al. |
| 5,287,237 A | * | 2/1994 | Kitada et al. .......... 360/327.32 |
| 5,408,377 A | | 4/1995 | Gurney et al. |
| 5,465,185 A | | 11/1995 | Heim et al. |
| 5,841,692 A | | 11/1998 | Gallagher et al. |
| 5,958,576 A | * | 9/1999 | Takiguchi ................... 428/332 |
| 5,966,012 A | | 10/1999 | Parkin |
| 6,153,320 A | | 11/2000 | Parkin |
| 6,197,439 B1 | * | 3/2001 | Parkin et al. ................ 428/678 |
| 6,280,813 B1 | | 8/2001 | Carey et al. |
| 6,689,497 B1 | * | 2/2004 | Girt ..................... 428/694 TM |
| 6,737,172 B1 | * | 5/2004 | Girt ........................... 428/611 |
| 2002/0098390 A1 | | 7/2002 | Van Do et al. |
| 2003/0104247 A1 | * | 6/2003 | Girt ........................... 428/693 |
| 2003/0180577 A1 | * | 9/2003 | Do et al. ............. 428/694 TM |
| 2004/0042128 A1 | * | 3/2004 | Slaughter et al. ......... 360/324.2 |

FOREIGN PATENT DOCUMENTS

JP      2001-056925      2/2001      ............ G11B/5/66

* cited by examiner

Primary Examiner—Michael La Villa
(74) Attorney, Agent, or Firm—Thomas R. Berthold

(57) ABSTRACT

The invention is a magnetic device, i.e., a magnetoresistive sensor or a magnetic tunnel junction device, that has a ferromagnetic structure of two ferromagnetic layers antiferromagnetically coupling together with an improved antiferromagnetically coupling (AFC) film. The AFC film is an alloy of $Ru_{100-x}Fe_x$ where x is between approximately 10 and 60 atomic percent. This AFC film increases the exchange coupling by up to a factor or two and has an hcp crystalline structure making it compatible with Co alloy ferromagnetic layers.

2 Claims, 3 Drawing Sheets

MAGNETIC DEVICE WITH IMPROVED ANTIFERROMAGNETICALLY COUPLING FILM

TECHNICAL FIELD

This invention relates to magnetic devices that use ferromagnetic layers exchange coupled antiferromagnetically by an antiferromagnetically coupling (AFC) film. These devices include magnetic recording disks, magnetoresistive read heads based on the giant magnetoresistance (GMR) effect, and magnetic tunnel junction (MTJ) devices for use as magnetic memory cells and magnetoresistive read heads.

This application claims the magnetic device as magnetoresistive read heads and MTJ devices, and a co-pending concurrently filed application claims the magnetic device as a magnetic recording disk.

BACKGROUND OF THE INVENTION

A magnetic recording disk that uses at least two ferromagnetic layers separated by an AFC film is described in U.S. Pat. No. 6,280,813, which is incorporated herein by reference. Ruthenium (Ru) is the preferred material for the AFC film because it has the same hexagonal-close-packed (hcp) crystalline structure as the cobalt (Co) alloy material in the ferromagnetic layers and has the strongest reported exchange coupling.

A spin-valve (SV) GMR read head is a sandwich structure comprising two uncoupled ferromagnetic layers separated by a nonmagnetic metallic electrically conducting spacer layer, typically copper (Cu), in which the magnetization direction (magnetic moment) of one of the ferromagnetic layers is fixed or pinned, while the magnetization direction of the free or sensing ferromagnetic layer is free to rotate. The basic SV magnetoresistive sensor is described in U.S. Pat. No. 5,206,590.

A magnetic tunnel junction (MTJ) device has two ferromagnetic layers separated by a nonmagnetic electrically insulating layer, called the tunnel barrier layer, which is typically formed of alumina. One of the ferromagnetic layers is a pinned layer whose magnetization direction is oriented in the plane of the layer but is fixed or pinned so as not to be able to rotate in the presence of an applied magnetic field. The pinned ferromagnetic layer may be pinned by interface exchange biasing with an adjacent antiferromagnetic layer, while the free ferromagnetic layer has its magnetization direction capable of rotation relative to the pinned layer's magnetization direction. The tunneling current that flows perpendicularly through the insulating tunnel barrier layer depends on the relative magnetization directions of the two ferromagnetic layers. MTJ devices have applications for use as memory cells in magnetic memory arrays and as magnetoresistive read heads in magnetic recording devices.

The SV magnetoresistive sensor and MTJ device have been improved by substitution of one or both of the free and pinned ferromagnetic layers with a laminated structure comprising two ferromagnetic films antiferromagnetically exchange coupled to one another in an antiparallel orientation by an AFC film. This laminated structure is magnetically rigid so that when used as the free ferromagnetic layer the two antiparallel films rotate together. These improved SV sensors are described in U.S. Pat. Nos. 5,408,377 and 5,465,185, which are incorporated herein by reference. The MTJ device has also been improved by substitution of this type of laminated structure for the free and pinned layers, as described in U.S. Pat. Nos. 5,841,692 and 5,966,012, which are incorporated herein by reference.

Ru is also the preferred material for the AFC film in these laminated structures used in SV sensors and MTJ devices. Ru exhibits strong antiferromagnetic coupling in the limit of very thin AFC films and very strong antiferromagnetic coupling between cobalt (Co), cobalt—iron (Co—Fe) and nickel-iron (Ni—Fe) ferromagnetic films, which form the pairs of antiparallel oriented ferromagnetic films in these laminated structures.

For some magnetic device applications it is desirable to increase the antiferromagnetic exchange coupling strength above that achieved by Ru. This is the case for magnetic recording disk applications where it is known that higher moment alloy ferromagnetic layers lead to stronger antiferromagnetic exchange coupling. Thus one approach to increase the exchange coupling in magnetic recording disks is to add high moment ferromagnetic material at the interfaces of the AFC film with the ferromagnetic layers. However, this approach requires additional layers in the disk and can also increase the intrinsic media noise.

What is needed is a material for an AFC film that increases the antiferromagnetic exchange coupling between the ferromagnetic layers.

SUMMARY OF THE INVENTION

The invention is a magnetic device with a ferromagnetic structure of two ferromagnetic layers antiferromagnetically coupled together with an improved AFC film. The AFC film is an alloy of $Ru_{100-x}Fe_x$ where x is between approximately 10 and 60 atomic percent. This AFC film increases the exchange coupling by up to a factor or two and has an hcp crystalline structure making it compatible with Co alloy ferromagnetic layers.

For a fuller understanding of the nature and advantages of the present invention, reference should be made to the following detailed description taken together with the accompanying figures.

DETAILED DESCRIPTION OF THE INVENTION

Prior Art Antiferromagnetically Coupled Magnetic Recording Disk

Figure 1:
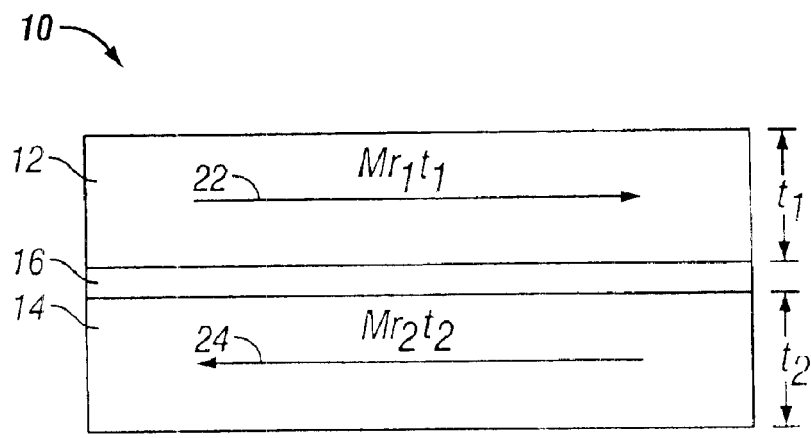
FIG. 1 is a schematic of a prior art AFC magnetic recording disk with an Ru AFC film.

FIG. 1 shows the prior art antiferromagnetically coupled magnetic recording disk 10 with two ferromagnetic films 12, 14 separated by an AFC film 16. The ferromagnetic films 12, 14 are typically formed of a Co alloy, such as CoPtCrB, and the AFC film is typically Ru. The thickness of the Ru AFC film 16 is chosen so that the magnetic moments 22, 24 of adjacent films 12, 14, respectively, are antiferromagnetically exchange coupled through the Ru film 16 and are antiparallel in zero applied fields. The films 12, 14 have magnetic moment values of $Mr_1t_1$ and $Mr_2t_2$, respectively, where Mr is the remanent magnetization and t is the layer thickness. The orientations of the magnetic moments 22, 24 of adjacent films 12, 14, respectively, are aligned antiparallel and thus add destructively to reduce the magnetic moment of the composite layer 10. The arrows 22, 24 represent the moment orientations of individual magnetic domains that are directly above and below one another across the AFC film 16.

Figure 2:
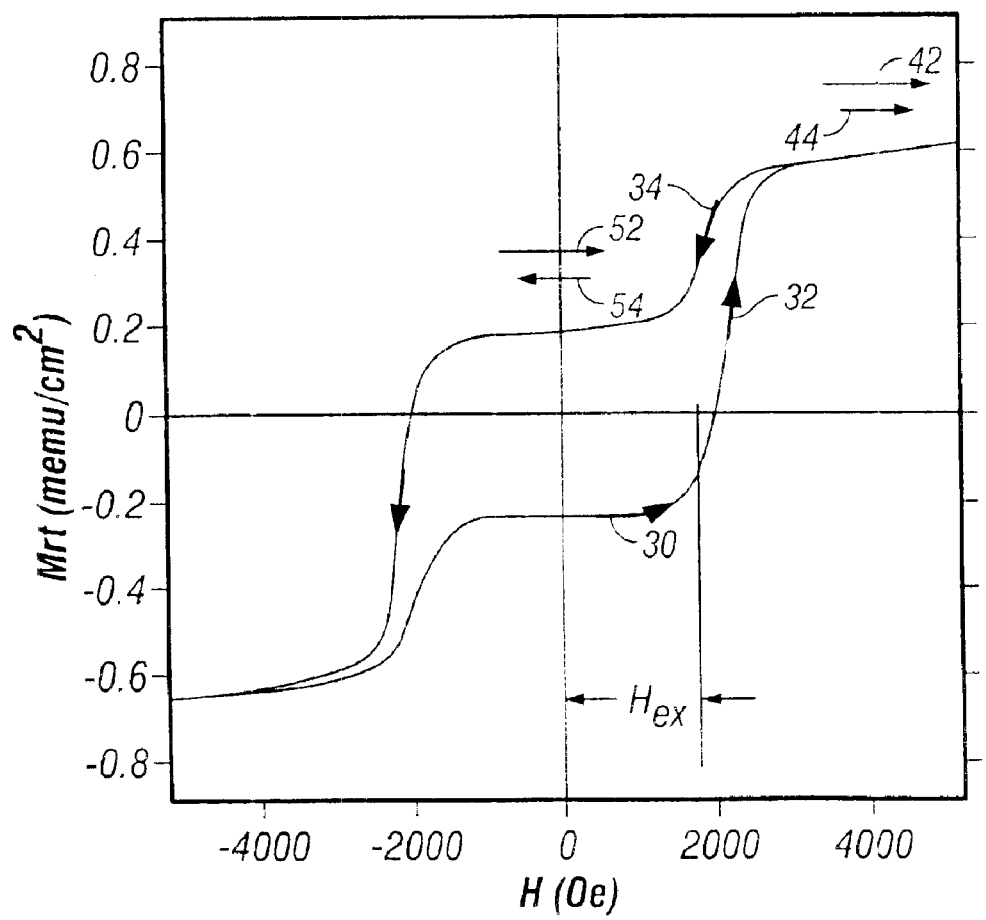
FIG. 2 is an M-H hysteresis loop for an AFC magnetic recording disk like that in FIG. 1.

FIG. 2 shows the major hysteresis loop for an antiferromagnetically coupled magnetic recording disk like that depicted in FIG. 1. The pairs of horizontal arrows indicate the orientation of the ferromagnetic films 12, 14 at different points in the hysteresis loop. The applied field is increased in the positive direction (arrows 30, 32). For large applied fields, the antiferromagnetic coupling is overcome and the moments of the two ferromagnetic films 12, 14 are both parallel to the applied field (arrows 42, 44). As the applied field is reduced (arrow 34) the moment of the thinner bottom ferromagnetic film 14 reverses and becomes antiparallel to the moment of the thicker top ferromagnetic film 12 (arrows 52, 54) and to the applied field, resulting in a drop in the net moment. This switch occurs roughly at the exchange field ($H_{ex}$) felt by the bottom film 14 arising from the coupling across the Ru AFC film 16. For an antiparallel alignment of the ferromagnetic films 12, 14 to be realized requires that the exchange field exceed the coercive field required to reverse the magnetization of the bottom ferromagnetic film 14.

The antiferromagnetically coupled films 12, 14 with AFC film 16 may also be incorporated into a laminated antiferromagnetically coupled magnetic recording disk, as described in published U.S. patent application US 2002/0098390 A1, which is incorporated herein by reference. In the case of such a laminated disk a nonmagnetic spacer film that does not provide antiferromagnetic coupling is located on top of the upper ferromagnetic film 12 and a third ferromagnetic film is located on top of this spacer film.

Prior Art Spin Valve Magnetoresistive Sensor

Figure 3:
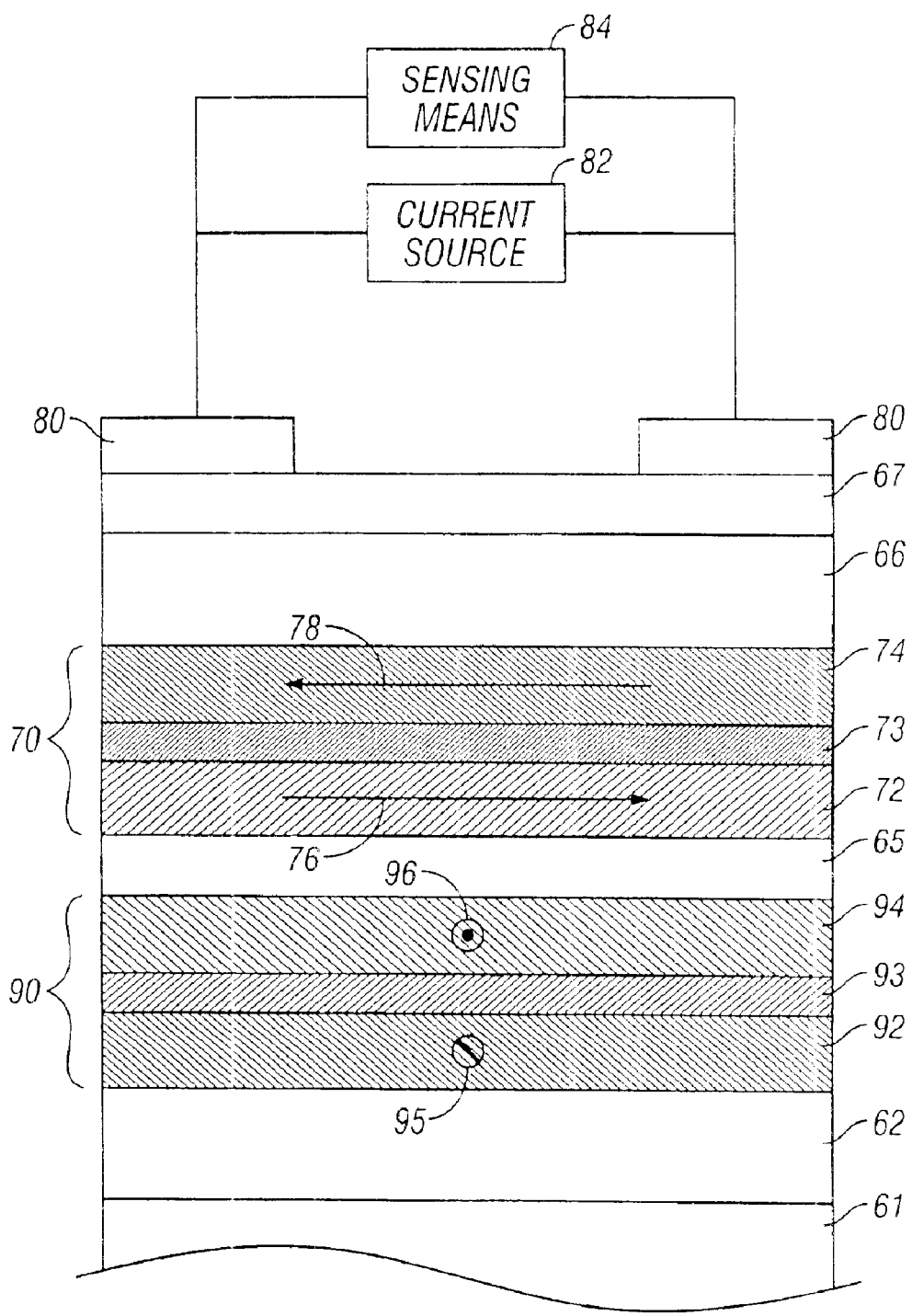
FIG. 3 is a schematic of a prior art SV magnetoresistive sensor with laminated antiferromagnetically coupled free and pinned ferromagnetic layers.

The SV magnetoresistive sensor with laminated antiferromagnetically coupled ferromagnetic films as both the free and pinned ferromagnetic layers is shown schematically in FIG. 3. The structure has a film of tantalum (Ta) as a buffer layer 62 formed onto a substrate 61. The laminated free ferromagnetic layer 90 comprises ferromagnetic NiFe (permalloy) films 92, 94 separated by a Ru AFC film 93. Ferromagnetic films 92, 94 have their magnetic moments aligned antiparallel, as shown respectively by arrow 95 into the paper and arrow 96 out of the paper. A Cu layer 65 is deposited onto the free layer 90 to serve as the nonferromagnetic metallic spacer layer for the spin valve structure. While Cu is shown, other nonferromagnetic metallic materials with high electrical conductivity, such as silver (Ag), gold (Au), and their alloys, can be used. The pinned ferromagnetic layer 70 is also a laminated structure that comprises a first ferromagnetic film 72 directly on the Cu spacer layer 65, a Ru AFC film 73 deposited onto the first film 72, and a second ferromagnetic film 74 on the Ru AFC film 73. The two pinned ferromagnetic films 72, 74 are deposited in the presence of an applied magnetic field rotated approximately 90 degrees from the field applied during the deposition of the free ferromagnetic layer 90. An antiferromagnetic iron-manganese (Fe—Mn) film 66 is deposited on the second film 74 to exchange couple with the second film 74. Other suitable antiferromagnetic layers include Ir—Mn, Pt—Mn, Pd—Mn and Ni—Mn. Finally, a capping layer 67 is formed over the Fe—Mn film 66. Suitable capping materials are high resistivity materials, such as Ta, zirconium (Zr), alloys of Cu and Au, or various oxides FIG. 3 also illustrates schematically the means for connecting the sensor to sensing circuitry in the magnetic recording system. Electrical leads 80 are provided to form a circuit path between the sensor and a current source 82 and a sensing means 84. As is well known in the art, additional sensor elements, such as transverse and longitudinal bias layers (not shown), may be required to provide an optimal sensor response circuit. A magnetic signal in the recording medium is sensed by the sensing means 84 detecting the change in resistance of the sensor as the magnetization direction of the laminated free ferromagnetic layer 90 rotates relative to the fixed magnetization direction of the laminated pinned ferromagnetic layer 70 in response to the applied magnetic signal from the recorded medium.

The two films 72, 74 in the laminated pinned layer 70 have magnetization directions indicated by arrows 76, 78, respectively. The antiparallel alignment of the moments of the two films 72, 74 is due to the antiferromagnetic coupling through the Ru AFC film 73. Because of this antiferromagnetic coupling, and because the two films 72, 74 have substantially the same thickness, the magnetic moments of each of the films cancel each other so that there is essentially no net magnetic moment in the laminated pinned layer 70. Thus, there is essentially no magnetic dipole field generated by the pinned layer 70, and thus no magnetic field to affect the direction of the net magnetic moment of the laminated free ferromagnetic layer 90.

Prior Art Magnetic Tunnel Junction Device

Figure 4:
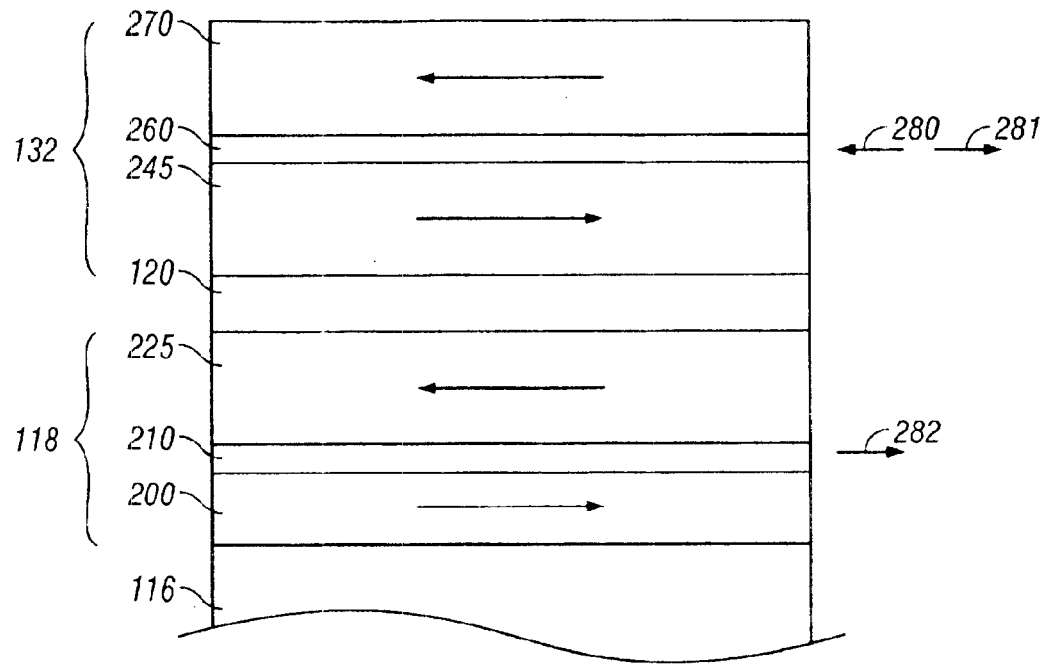
FIG. 4 is a schematic of a prior art MTJ device with laminated antiferromagnetically coupled free and pinned ferromagnetic layers.

A MTJ device is shown in FIG. 4. A laminated fixed ferromagnetic layer 118 is comprised of a sandwich of two ferromagnetic films 200 and 225 separated by a nonferromagnetic Ru AFC film 210 which couples the ferromagnetic films 200 and 225 antiferromagnetically such that the magnetic moments of films 200 and 225 are arranged antiparallel to one another. The two ferromagnetic films 200 and 225 in the laminated fixed ferromagnetic layer 118 have magnetic moments that are antiparallel due to the antiferromagnetic exchange coupling through the antiferromagnetically coupling film 210. Because of this antiferromagnetic coupling, and because the two ferromagnetic films 200, 225 can be made to have substantially the same thickness, the magnetic moments of each of the films essentially cancel each other so that there is essentially no net magnetic moment in the fixed ferromagnetic layer 118. Thus, there is essentially no magnetic dipole field generated by the fixed ferromagnetic layer 118, and thus no magnetic field to affect the direction of magnetization of the free or sensing ferromagnetic layer 132. Because it is not possible to precisely form each of the films to the exact same thickness, the net moment of the fixed ferromagnetic layer 118 will likely be a small but nonzero value as a natural result of the normal deposition process. The lower ferromagnetic film 200 is deposited on the antiferromagnetic exchange layer 116, which provides exchange biasing for film 200 so that the moment of film 200 is prevented from rotation in the presence of a magnetic field in the range of interest. Because film 225 is antiferromagnetically coupled to film 200 it too is prevented from rotation.

Similarly the free ferromagnetic layer 132 is comprised of two ferromagnetic films 245 and 270 separated by a thin nonferromagnetic AFC film 260 which couples the moments of films 245 and 270 antiferromagnetically.

In the MTJ device of FIG. 4, the laminated fixed 118 and free 132 ferromagnetic layers are separated by the nonmagnetic spacer 120, which is the insulating tunnel barrier layer, typically formed of alumina. When the MTJ device is used as a magnetoresistive recording head, the magnetic moments of the ferromagnetic films making up the fixed and free ferromagnetic layers will have the orientations as shown in FIG. 3 for the SV GMR head. However, when the MTJ device is used as a magnetic memory cell, the moments of the ferromagnetic films in each of the laminated ferromagnetic layers 118, 132 will be aligned antiparallel with one another, but the moments of the free ferromagnetic films 245, 270 will rotate together as a rigid unit so that the net moment of free ferromagnetic layer 132 will be either parallel (arrow 280) or antiparallel (arrow 281) to the net moment (arrow 282) of the fixed ferromagnetic layer 118.

Preferred Embodiments

The present invention is a magnetic device like those described above, but wherein the AFC film is formed of a Ru—Fe alloy. The structure of an AFC magnetic recording disk is typically substrate\seed layers\underlayers\ferromagnetic layer 1\AFC film\ferromagnetic layer 2\overcoat.

The use of a Ru—Fe alloy as the AFC film substantially increases the exchange coupling strength between the two ferromagnetic layers.

For an alloy of $Ru_{65}Fe_{35}$ as the AFC film (where the subscripts denote atomic percent), the exchange field ($H_{ex}$) acting on the bottom ferromagnetic layer was measured to be 2750 Oe compared to 1575 Oe for a pure Ru AFC when using the same ferromagnetic alloys and thicknesses for ferromagnetic layers 1 and 2. By referring to FIG. 2 it will be appreciated that the higher $H_{ex}$ means that a thicker and/or higher coercivity material can be used for the bottom ferromagnetic layer. In addition, the resulting structure will be more stable.

Figure 5:
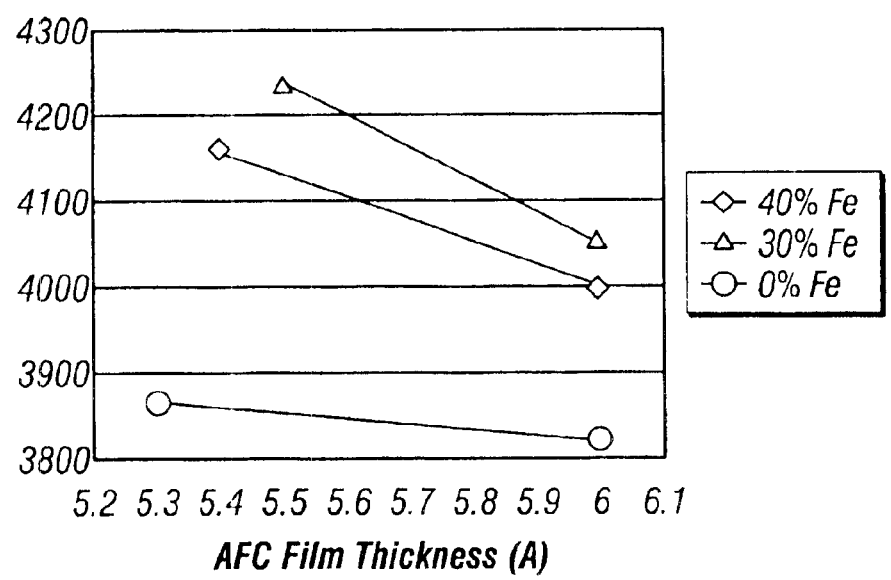
FIG. 5 is a graph comparing coercivities for AFC magnetic recording disks made with a prior art Ru AFC film and with the Ru—Fe alloy AFC films of the present invention, with various atomic percentages of Fe.

FIG. 5 shows coercivities as a function of AFC film thickness for the structure substrate\$CrTi_{50}$\RuAl\$CrTi_{20}$\ferromagnetic layer $CoCr_{10}$\AFC film of Ru or $Ru_{65}Fe_{35}$\ferromagnetic layer $CoPt_{12}Cr_{16}B_9$\overcoat CNx.

The higher coercivity for the disks made with Ru—Fe compared to Ru results from the higher coupling strength provided by the Ru—Fe AFC film. The advantages of higher antiferromagnetic exchange coupling strength include the potential to increase the Mrt of the bottom ferromagnetic layer and increased flexibility in using lower moment ferromagnetic layers in contact with the AFC film.

The composition range for the improved AFC film is $Ru_{100-x}Fe_x$, where x is between approximately 10 and approximately 60 atomic percent. This alloy interlayer increases the exchange coupling by up to a factor or two and has an hcp crystalline structure so as to be compatible with existing disk structures. The lower end of this range is that atomic percent of Fe where the increased exchange coupling is first noticeable, and the upper end of this range is where the Ru—Fe alloy becomes ferromagnetic and/or loses its hcp crystalline structure.

FIGS. 2 and 3 show magnetic devices where both the free and fixed ferromagnetic layers can be made with the laminated structures according to the present invention. However, it is within the scope of the present invention that either one or the other of the free and fixed ferromagnetic layers can be the laminated structure.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A magnetoresistive spin valve sensor comprising:

a substrate;

a fixed ferromagnetic layer formed on the substrate and having its magnetization direction pinned in the absence of an applied magnetic field;

a nonmagnetic metallic electrically conducting spacer layer in contact with the fixed ferromagnetic layer; and a free ferromagnetic layer in contact with the spacer layer and having its magnetization direction free to rotate relative to the magnetization direction of the fixed ferromagnetic layer; and wherein at least one of the fixed and free ferromagnetic layers comprises first and second ferromagnetic films antiferromagnetically coupled to one another and an antiferromagnetically coupling film located between and in contact with the first and second ferromagnetic films and having a thickness sufficient to couple the first and second ferromagnetic films together with their magnetic moments oriented antiparallel to one another, the antiferromagnetically coupling film being formed of a material consisting essentially of Ru and Fe and having a composition $Ru_{100-x}Fe_x$ wherein x is between approximately 10 and approximately 60 atomic percent.

2. A magnetic tunnel junction device comprising:

a substrate;

a fixed ferromagnetic layer having its magnetization direction fixed in the absence of an applied magnetic field;

an insulating tunnel barrier layer in contact with the fixed ferromagnetic layer; and a sensing ferromagnetic layer having its magnetization direction free to rotate relative to the magnetization direction of the fixed ferromagnetic layer and in contact with the insulating tunnel barrier layer; and wherein at least one of the fixed and sensing ferromagnetic layers comprises first and second ferromagnetic films antiferromagnetically coupled to one another and an antiferromagnetically coupling film located between and in contact with the first and second ferromagnetic films and having a thickness sufficient to couple the first and second ferromagnetic films together with their magnetic moments oriented antiparallel to one another, the antiferromagnetically coupling film being formed of a material consisting essentially of Ru and Fe and having a composition $Ru_{100-x}Fe_x$ wherein x is between approximately 10 and approximately 60 atomic percent.

* * * * *